(12) United States Patent
Donkoh

(10) Patent No.: US 8,848,413 B2
(45) Date of Patent: Sep. 30, 2014

(54) LOW POWER REGISTER FILE

(71) Applicant: Eric Kwesi Donkoh, Hillsboro, OR (US)

(72) Inventor: Eric Kwesi Donkoh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/715,612

(22) Filed: Dec. 14, 2012

(65) Prior Publication Data
US 2014/0169109 A1    Jun. 19, 2014

(51) Int. Cl.
*G11C 15/00* (2006.01)
*G11C 7/00* (2006.01)
*G11C 7/12* (2006.01)

(52) U.S. Cl.
CPC ........................................ *G11C 7/12* (2013.01)
USPC .......................................... 365/49.11; 365/191

(58) Field of Classification Search
USPC .............................................................. 365/191
See application file for complete search history.

(56) References Cited

U.S. PATENT DOCUMENTS 7,602,629 B2 * 10/2009 Wickeraad .................... 365/49.1
7,952,941 B2 *  5/2011 Wijeratne et al. ........ 365/189.11
8,456,923 B2 *  6/2013 Geuskens et al. ........ 365/189.02

* cited by examiner

*Primary Examiner* — Son Mai
(74) *Attorney, Agent, or Firm* — Blakely, Sokoloff, Taylor & Zafman LLP

(57) ABSTRACT

Described is an apparatus which comprises: a memory cell with a data port; and a logic gate, coupled to the data port of the memory cell, to generate a data word-line signal according to data on the data port and an asynchronous word-line signal, wherein the logic gate is operable to gate data on the data port during low power mode.

20 Claims, 9 Drawing Sheets

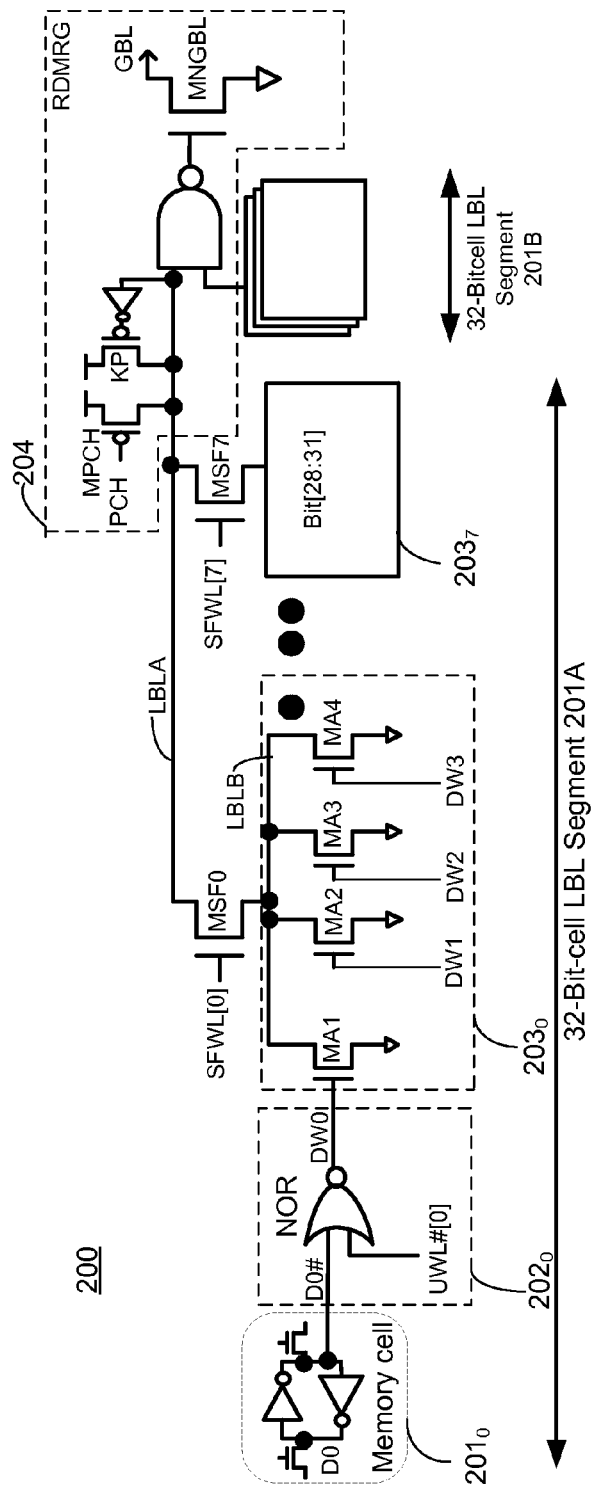
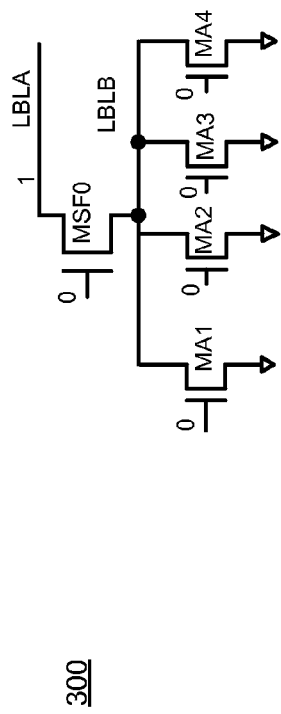
Fig. 2
Fig. 3

LOW POWER REGISTER FILE

BACKGROUND

Register Files (RFs) are used in high performance microprocessors for storing data due to their relatively fast access and ease of design and implementation compared to alternatives, such as caches. RFs thus constitute a large portion of circuitry on a modern microprocessor.

However, conventional RFs suffer from excessive leakage power consumption. For example, leakage alone in a conventional RF may account for one third of leakage of the overall microprocessor. As demand for lower power devices is increasing, such high leakage power consumption in conventional RFs is a challenge.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2 is a NOR logic based low power local bit-line circuit for RF architecture, according to one embodiment of the disclosure.

FIG. 3 is a circuit illustrating the leakage condition for the local bit-line circuit, according to one embodiment of the disclosure.

DETAILED DESCRIPTION

Figure 1A:
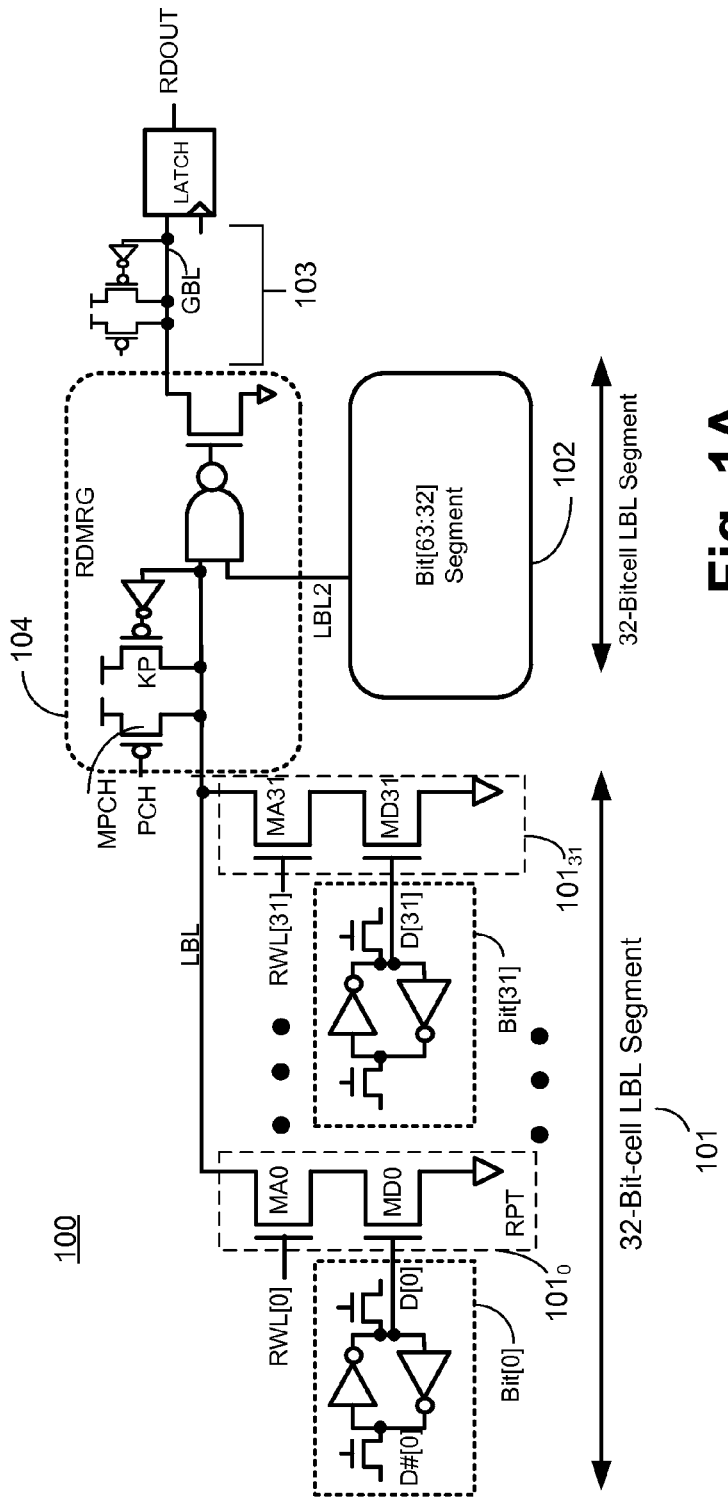
FIG. 1A is a conventional high level Register File (RF) architecture.

FIG. 1A is a conventional high level RF architecture 100. RF architecture 100 shows a typical RF dynamic/domino read structure with 32 bits per LBL (local bit-line) segment—$101_0$ to $101_{31}$. RFs are usually organized by bits and entries. Read ports (RPTs) from different memory entries (e.g., $101_0$ to $101_{31}$) form a segment of LBL in an M×1 wide-NOR multiplexer, where 'M' represents number of entry RPTs. Each RPT comprises a stack of two n-type devices e.g., MA0 and MD0, where output D[0] of memory cell (Bit[0]) controls MD0, and where MA0 is controlled by read word-line e.g., RWL[0]. A pre-charge signal (PCH) is generated to control p-type MPCH (part of 104), while a p-type keeper device KP is used to hold up the logical value of LBL when LBL is not being read. Unit 104 is the read merge (RDMRG) unit that merges a number of LBL segments, for example, 101 and 102 (i.e., logic operation on LBL and LBL2). D[0] and D#[0] are also referred as data ports of the memory cell bit[0], where signal D#[0] is a logical inverse signal D[0].

NAND gate of 104 may be used to combine two LBL segments—one from $101_{0-31}$ (collectively referred to as 101) and another from 102 which is another 32 bit segment. This is further merged at the global bit-line (GBL) 103, also implemented using wide-NOR dynamic logic. A latch may be used to capture the data read from the bit-cell to generate RDOUT (Read out) signal. The LBLs and GBLs are pre-charged to Vcc (power supply) during standby (a low power state).

Figure 1B:
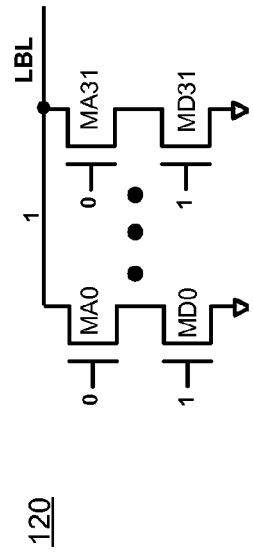
FIG. 1B is part of read port which exhibits worst case leakage condition for the conventional high level RF architecture.

FIG. 1B illustrates a part of the RPT 120 that exhibits worst case leakage condition for the conventional high level RF architecture 100. Worst case leakage condition occurs when the memory cell data 'D' stores a logical high and word-line is logical low. Under worst-case leakage condition, charge (indicated as '1') on node LBL leaks through transistors MA (e.g., MA0-MA31). The leakage is usually reduced by using a low-leakage device on the read port. However, not all process technologies provide low and high threshold devices. The worst-case leakage condition during read operation may also result in LBL DC (direct current) droop which can lead to functional failure if the keeper KP is not strong enough.

To address the DC droop issue, keeper KP is sized to meet a DC droop constraint. However, larger keeper size (W/L) reduces LBL fall delay time. The critical timing path trace for this implementation starts from the clocking (GCLK) through the read word-line (RWL) to the local bit-line (LBL) and downstream as shown with reference to FIG. 1C.

Figure 1C:
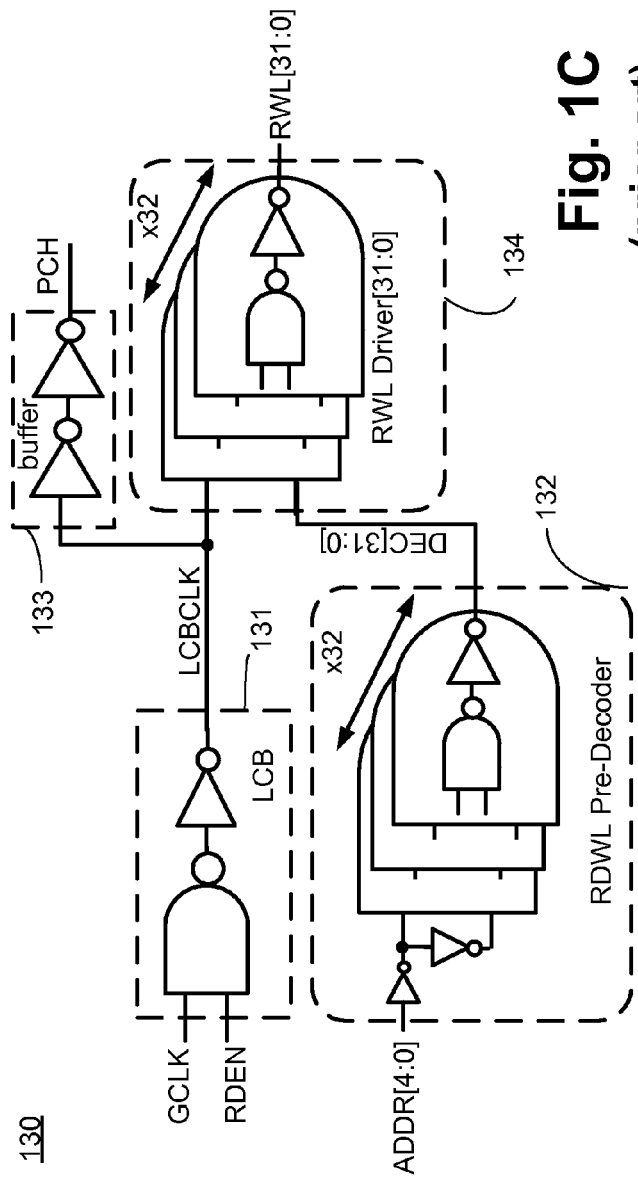
FIG. 1C is a logic unit for word-line decoding and clocking for the conventional RF.

FIG. 1C is a logic unit 130 for word-line decoding and clocking for the conventional RF. FIG. 1C is described with reference to FIG. 1A. Logic unit 130 comprises a local clock buffer (LCB) 131 that generates LCBCLK (clock signal) from global clock (GCLK) and enable signal RDEN (Read Enable). Logic unit 130 performs an AND function and comprises a NAND gate followed by an inverter. LCBCLK is buffered by buffer 133 to generate read pre-charge clock (PCH) which is provided to MPCH. Logic unit 130 also comprises read word-line (RDWL) pre-decoder 132 that decodes an address.

For example, five bit address ADDR[4:0] is decoded by combinational logic to generate a 32 bit decoded address DEC[31:0]. Logic unit 130 further comprises read word-line driver 134 to generate read access word-line signals (RWLs), for example, RWL[0] to RWL[31], for a bit segment. RWLs are generated by clocking the decoded address DEC[31:0] (32 bit wide address) with clock LCBCLK by the 32 bit RWL driver 134.

Figure 1D:
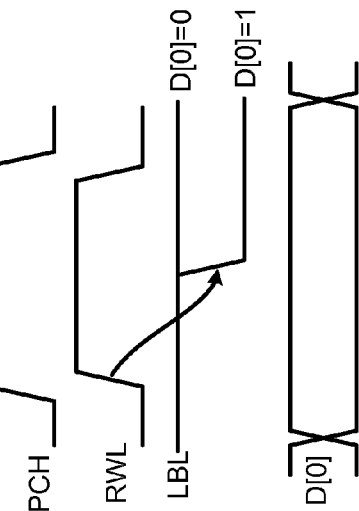
FIG. 1D is a timing diagram of the logic unit for word-line decoding and clocking for the conventional RF.

FIG. 1D is a timing diagram 140 of the logic unit for word-line decoding and clocking for the conventional RF. FIG. 1D is described with reference to FIGS. 1A-C. The x-axis is time and the y-axis is voltage or data. During read access, read pre-charge clock (PCH) goes high and turns OFF the LBL PCH device MPCH. In this example, RWL initiates read access to a single entry. If the memory entry (D[0], for example) being accessed stores logical high data (i.e., data '1'), LBL node is discharged to ground, causing a "domino" chain of evaluation on the path through the NAND, GBL, and latches downstream.

If the memory entry (D[0], for example) being accessed stores data which is logical low, LBL node should retain its pre-charged value ('1') during the entire read phase with the PCH device MPCH OFF. In such a case, keeper KP holds the pre-charged value on node LBL to prevent false evaluation, withstanding any noise impact from charge sharing, LBL interconnect, propagated noise from the RWL signals, and DC droop from RPT device.

However, conventional RF architecture as described by FIGS. 1A-D suffers from slow read access time caused by making a stronger keeper KP, for example. The conventional RF architecture as described by FIGS. 1A-D also exhibits high leakage. For example, conventional RF architecture exhibits about a third of total microprocessor leakage. Conventional RF architecture as described by FIGS. 1A-D also suffers from lack of efficient design scaling. For example, devices continue to scale much better than metals and so the memory bit-cell area in the RF units is constrained by routing signals. Additionally, conventional LBL domino implementation requires word-line shielding for noise tolerance, which results in increased RF array area, for example, in multi-ported arrays. Conventional RF architecture as described by FIGS. 1A-D also suffers from bit-line noise.

The embodiments describe an apparatus which comprises: a memory cell (e.g., an SRAM memory cell) with a data port; a logic gate, coupled to the data port of the memory cell, to generate a data word-line signal according to data on the data port and an asynchronous word-line signal; and stacked devices to generate local bit-line in response to the data word-line signal and a synchronous word-line signal. In one embodiment, the logic gate is operable to gate the data on the data port to reduce leakage on the node having the local bit-line.

The embodiments also describe an apparatus comprising: a memory cell with a data port; and a logic gate, coupled to the data port of the memory cell, to generate a data word-line signal according to data on the data port and an asynchronous word-line signal, wherein the logic gate is operable to gate data on the data port during low power mode.

The embodiments discussed exhibit several advantages over conventional RF architecture of FIGS. 1A-D. Some non-limiting technical effects of the embodiments include improvement in LBL delay by over 50%. The RF architecture of the embodiments exhibits reduction in total leakage power consumption over the RF architecture of FIGS. 1A-D. For example, total leakage of the RF architecture of the embodiments is reduced by 60% over leakage power consumption of RF architecture of FIGS. 1A-D. The RF architecture of the embodiments also decouples the word-line from read port, making it static, which substantially eliminates word-line shielding requirements. By substantially eliminating word-line shielding requirements, RF array size can be reduced in a metal constrained array bit-cell. The RF architecture of the embodiments substantially eliminates propagated noise from the word-line onto LBL due to static NOR/NAND attenuation. The RF architecture of the embodiments also exhibits better VccMin scalability, where "VccMin" is the minimum power supply level at which the RF array continues to functionally operate. Other technical effects are also possible from the embodiments of the RF architecture.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

The term "scaling" refers to converting a design (schematic and layout) from one process technology to another process technology. The terms "substantially," "close," "approximately," "near," "about," herein refer to being within +/−20% of a target value. The term "set" generally refers to a group of items (e.g., diodes, resistors, transistors, wires, etc.). A set may have a single item or multiple items.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNPi/NPN, Bi-CMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

The term "power mode" generally refers to the power states as described in the Advanced Configuration and Power Interface (ACPI) Revision 5.0 published Nov. 23, 2011. Examples, of power mode include "sleep mode," "wake-up mode," "idle mode," "C-states," etc. However, the embodiments are not limited to the ACPI power modes. Other standards and non-standards for power modes can also be used with the embodiments.

FIG. 2 is a NOR logic based low power local bit-line circuit for RF architecture 200, according to one embodiment of the disclosure. It is pointed out that those elements of FIG. 2 having the same reference numbers (or names) as the elements of any other figure can operate or function in any manner similar to that described, but are not limited to such.

In one embodiment, RF architecture 200 comprises memory cells (e.g., $201_0$), NOR gating logic 202 (e.g., $202_0$-N, where 'N' is an integer), RPTs 203 (e.g., $203_{0-N}$, where 'N' is an integer, e.g., 7), stack-force word-line devices (e.g., MSF0-MSF7), read merge unit (RDMRG) 204 having precharge device MPCH, keeper device KP, NAND logic, and global bit-line (GBL) generator MNGBL. In this embodiment, two 32 bit-cell 4×8 LBL configuration are shown—201A and 201B. However, the embodiments of this disclosure are not limited to the 32 bit-cell 4×8 LBL configuration. In one embodiment, static NOR logic is used to generate data word-line using an un-clocked word-line. In such embodiment, read port stacking is enforced which reduces leakage on LBL node during standby (or sleep) mode i.e., regardless of data polarity in the memory cell (e.g., $201_0$), stacking of devices resulting in low (if any) leakage on LBL is realized. The embodiment also results in a 2-stack read port with multiplexer select for increased scalability of LBL, enabling increased number of bit-cells per LBL segment.

In one embodiment, memory cell $201_0$ is a 6T SRAM (Static Random Access Memory) cell, where 'T' refers to transistors. In other embodiments, other types of the memory cells may be used. For example, 8T SRAM cell, 5T SRAM cell, 4T SRAM cell, Dynamic RAM, Phase Change Memory (PCM), and other volatile and non-volatile memory cells.

In one embodiment, NOR gating logic, e.g., $202_{0-3}$, collectively referred to as 202, performs a NOR operation on data node D# (e.g., D0#) and UWL# (e.g., UWL#[0]) to generate data word-line (DW) signal (e.g., DW0-DW3), where D# is inverse of D which is data stored in the memory element of the memory cell (e.g., $201_0$), and where UWL# is an un-clocked (static) word-line signal. DW signal is used to drive bit-line read ports by driving device(s) MA (e.g., MA1-MA4). For example, DW1 generated from another NOR gating logic (e.g., $202_1$, which is not shown) drives MA1, DW2 generated from another NOR gating logic (e.g., $202_2$, which is not shown) drives MA2, and DW3 generated from another NOR gating logic (e.g., $202_3$, which is not shown) drives MA3.

In one embodiment, RPTs are grouped into sub-segments e.g., $203_{0-7}$, where each sub-segment e.g., $203_0$, comprises n-type transistors MA1-MA4 coupled together in parallel to one another. In this embodiment, the RPT of each sub-segment (e.g., $203_{0-7}$) is coupled in series with a corresponding n-type stack-force transistor (e.g., MSF0-MSFT). In one embodiment, stack-force transistors MSF0-MSFT are controlled by word-line signals SFWL[0]-SFWL[7]. In one embodiment, MSF transistors (e.g., MSF0-MSFT) are used for multiplexing multiple RPT sub-segments.

So as not to obscure the embodiments, NOR logic gate $202_0$, RPT segment $203_0$, and stack-force word-line transistor MSF0 are discussed. The same explanation applies to other repeated sections of RF architecture 200. The terms node, signals on the node, and signals are interchangeably used. For example, LBL is referred as node LBL, signal LBL, voltage LBL, charge LBL, etc.

In one embodiment, one terminal (drain/source) of MSF0 is coupled to node LBLB while the other terminal (source/drain) of MSF0 is coupled to node LBLA, where LBLA is logically equivalent to LBL of FIG. 1A. Compared to FIG. 1A, LBL of FIG. 2 is organized as M×N matrix, where 'M' is the number of bit-cells per LBLB sub-segment and N is the number of LBLB sub-segments per LBLA segment. In one embodiment, LBLA multiplexer select signal SFWL[0] is decoded from address and is clocked to satisfy the LBL domino clocking requirement. In such an embodiment, read word-line UWL#[0] may not be clocked which reduces the number of clocked signals by a factor of 'M' compared to the number of clock signals in RF architecture 100.

In one embodiment, RDMRG 204 having p-type precharge device MPCH, p-type keeper device KP, NAND logic, and global bit-line (GBL) generator MGBL perform the same functions as described with reference to RDMRG 104 in FIGS. 1A-D. NAND logic (part of 204) may be used to merge two LBL segments onto a common GBL driver MNGBL. Alternately an inverter can be used instead of a NAND logic (part of 204) if there is only one segment.

The embodiment of FIG. 2 illustrates a low leakage RF architecture in which static NOR logic is used to combine memory bit-cell data (e.g., D0#) and un-clocked static word-line UWL# (e.g., UWL0#) to generate status data word-line DW (e.g., DW0) to drive bit-line read ports. The embodiment of FIG. 2 also illustrates that stacking of read port devices (e.g., stacking of MA1-MA4 via MSF0) is enforced to reduce leakage regardless of bit-cell data (e.g., D0#) polarity. For example, both DW (e.g., DW0) and SFWL (e.g., SFWL[0]) are '0' to cause MA1 and MSF0 to be in OFF state to reduce read port leakage without depending on data stored on the memory cell (e.g., $201_0$). The embodiment of FIG. 2 also illustrates a scalable design in which bit-cells coupled to LBL (e.g., $203_{0-7}$) can be increased with little design overhead and with little (if any) impact on LBL DC (direct current) droop from leakage.

FIG. 3 is a circuit 300 illustrating the leakage condition for the local bit-line circuit, according to one embodiment of the disclosure. It is pointed out that those elements of FIG. 3 having the same reference numbers (or names) as the elements of any other figure can operate or function in any manner similar to that described, but are not limited to such. FIG. 3 illustrates RTP $203_0$ coupled to MSF0 to generate LBLA.

As discussed with reference to FIG. 2, word-line UWL#[0] is un-clocked and is logically combined with the bit-cell data D0# through static NOR logic in $202_0$ to generate data-word-line DW0. In one embodiment, during the off state (e.g., sleep mode, standby mode, or another form of low power mode), UWL#=1 and DW=0 i.e., DW0, DW1, DW2, and DW3 are all zero. In sleep mode, SFWL will be a zero (e.g. SFWL[0]=0) which enforces stacking on LBL read ports via devices MSF0 and MA1-MA4. Such stacking significantly reduces leakage power consumption regardless of bit-cell data polarity.

Figure 4:
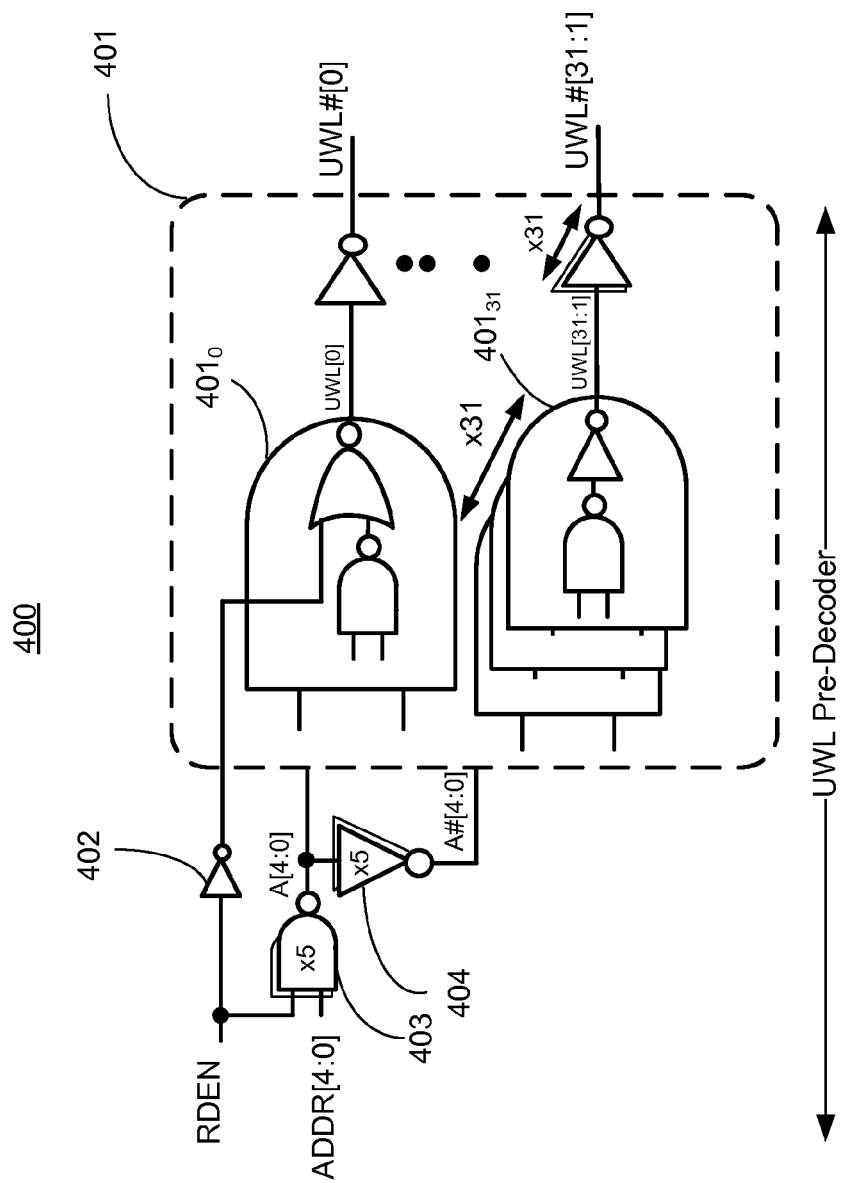
FIG. 4 is a logic unit for generating static word-line for the low power local bit-line circuit for RF architecture, according to one embodiment of the disclosure.

FIG. 4 is a logic unit 400 (UWL pre-decoder) for generating static word-line for the low power local bit-line circuit for RF architecture, according to one embodiment of the disclosure. It is pointed out that those elements of FIG. 4 having the same reference numbers (or names) as the elements of any other figure can operate or function in any manner similar to that described, but are not limited to such. FIG. 4 is described with reference to FIG. 2.

In one embodiment, UWL pre-decoder 400 comprises combination logic to generate UWL# signals (i.e., UWL#[31:0]) via address signals (ADDR[4:0]) and/or read enable signal (RDEN). In one embodiment, RDEN signal is used to state-force UWL# signals (i.e., UWL#[31:0]) to logic state "0" when in standby mode (low power mode). In one embodiment, UWL pre-decoder 400 comprises NAND logic gate 401 formed from a plurality of AND gates (e.g., $401_{1-31}$) followed by inverters to generate 31 UWL# signals. In one embodiment, NAND gate 403 is followed by NOR gate $401_0$ and inverter to generate UWL#[0]. In one embodiment, inputs to NAND logic gate 401 are generated by combinational logic 403 (NAND gate, in this embodiment 5 NAND gates) and inverters 402 and 404 (in this embodiment 5 inverters). The embodiments are not limited to the combinational logic of 400, other logic units may be used to generate asynchronous UWL signals according to the functional description of UWL signals.

Figure 5:
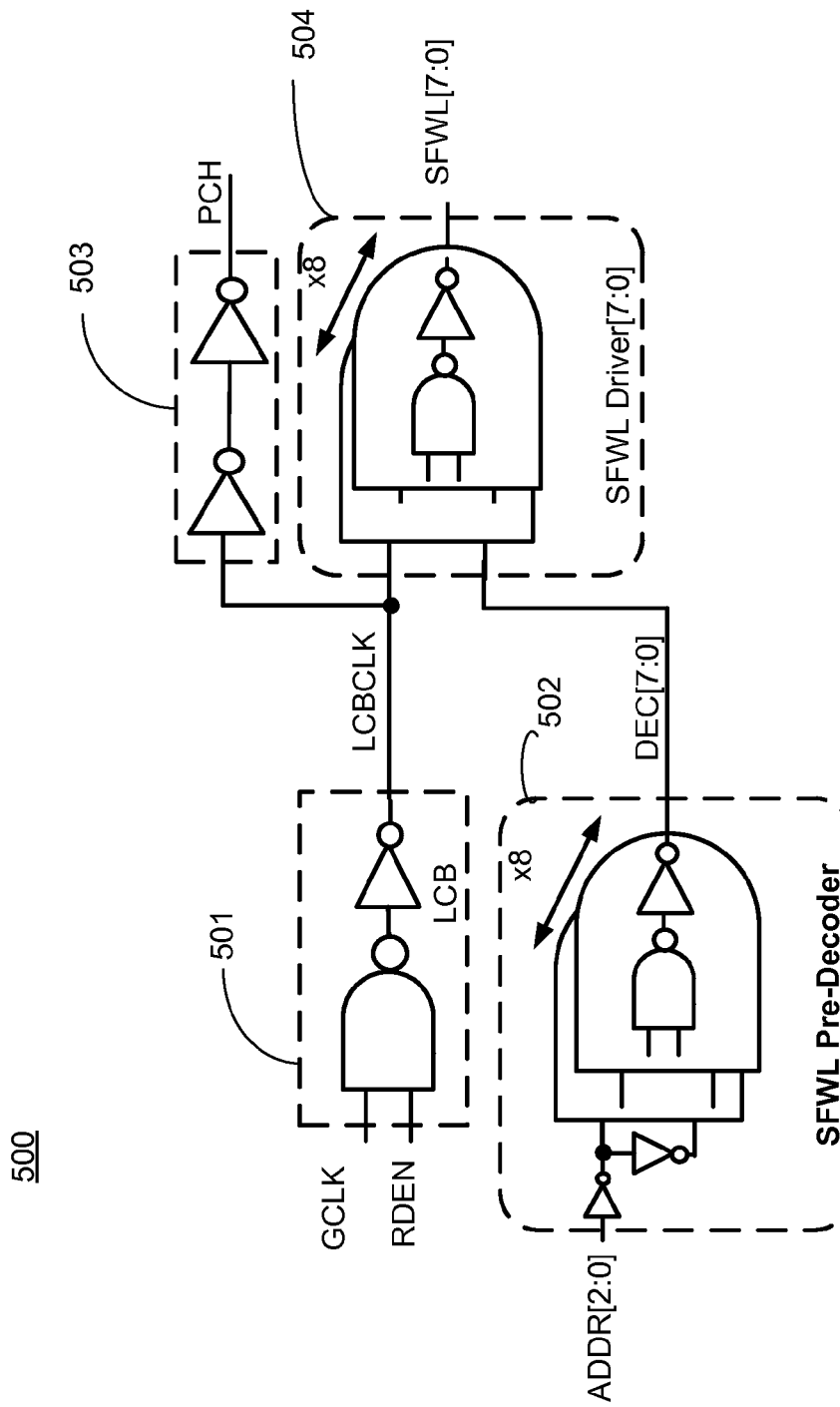
FIG. 5 is a logic unit for word-line decoding and clocking for the power local bit-line circuit for RF architecture, according to one embodiment of the disclosure.

FIG. 5 is a logic unit 500 for word-line decoding and clocking for the low power local bit-line circuit for RF architecture, according to one embodiment of the disclosure. It is pointed out that those elements of FIG. 5 having the same reference numbers (or names) as the elements of any other figure can operate or function in any manner similar to that described, but are not limited to such. FIG. 5 is described with reference to FIG. 2.

The embodiment of FIG. 5 is similar to the embodiment of FIG. 1C. In one embodiment, logic unit 500 comprises a local clock buffer (LCB) 501 that generates LCBCLK via GCLK (global clock) and RDEN (read enable) signals. In one embodiment, logic unit 500 comprises stack-force word-line (SFWL) pre-decoder 502 that generates decoded signals DEC[7:0] from address signals ADDR[2:0]. In one embodiment, logic unit 500 comprises buffer 503 to buffer LCBCLK signal as PCH (pre-charge) signal. In one embodiment, logic unit 500 comprises SFWL driver 504 that generates SFWL [7:0] signals by performing a logic AND function on LCBCLK and DEC[7:0] signals. The embodiments are not limited to the combinational logic design of FIG. 5. Any logic unit that may generate signals SFWL[7:0] and PCH according to their described functions may be used.

Figure 6:
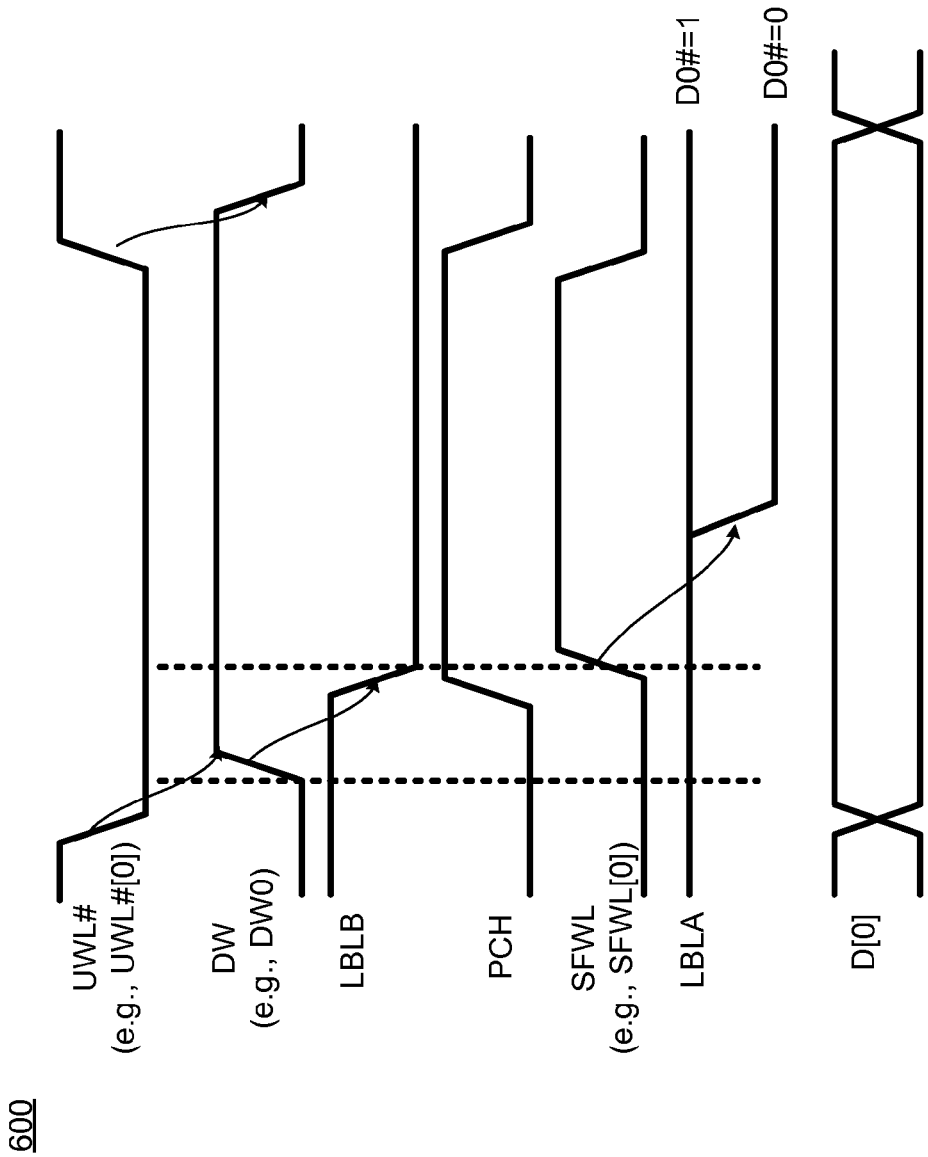
FIG. 6 is a timing diagram of the low power local bit-line circuit for RF architecture, according to one embodiment of the disclosure.

FIG. 6 is a timing diagram 600 of the low power local bit-line circuit for the RF architecture 200, according to one embodiment of the disclosure. It is pointed out that those elements of FIG. 6 having the same reference numbers (or names) as the elements of any other figure can operate or function in any manner similar to that described, but are not limited to such. FIG. 6 is described with reference to FIGS. 2-5.

Timing diagram 600 shows signals UWL# (e.g., UWL# [0]), DW (e.g., DW0), LBLB, PCH, SFWL (e.g., SFWL[0]), LBLA, and D (e.g., D[0]). During read access, the unlocked word-line UWL# (e.g., UWL#[0]), which is about some (e.g., two) logic gate stages faster due to the elimination of the clocking state, selects one bit-cell RPT of a sub-segment (e.g., $203_0$). If "D0#" is '0', then "DW0" rises and starts to discharge LBLB node. PCH is then turned OFF and SFWL is asserted after some gate delay (e.g., two gate delays) to select a LBLB sub-segment, discharging charge on LBLA node. In one embodiment, SFWL timing corresponds to the conventional RWL of FIG. 1D. In the standby mode, UWL# is reset to '1', DW0 reset to '0', and SFWL is reset to '0', enforcing LBL stacking.

Figure 7:
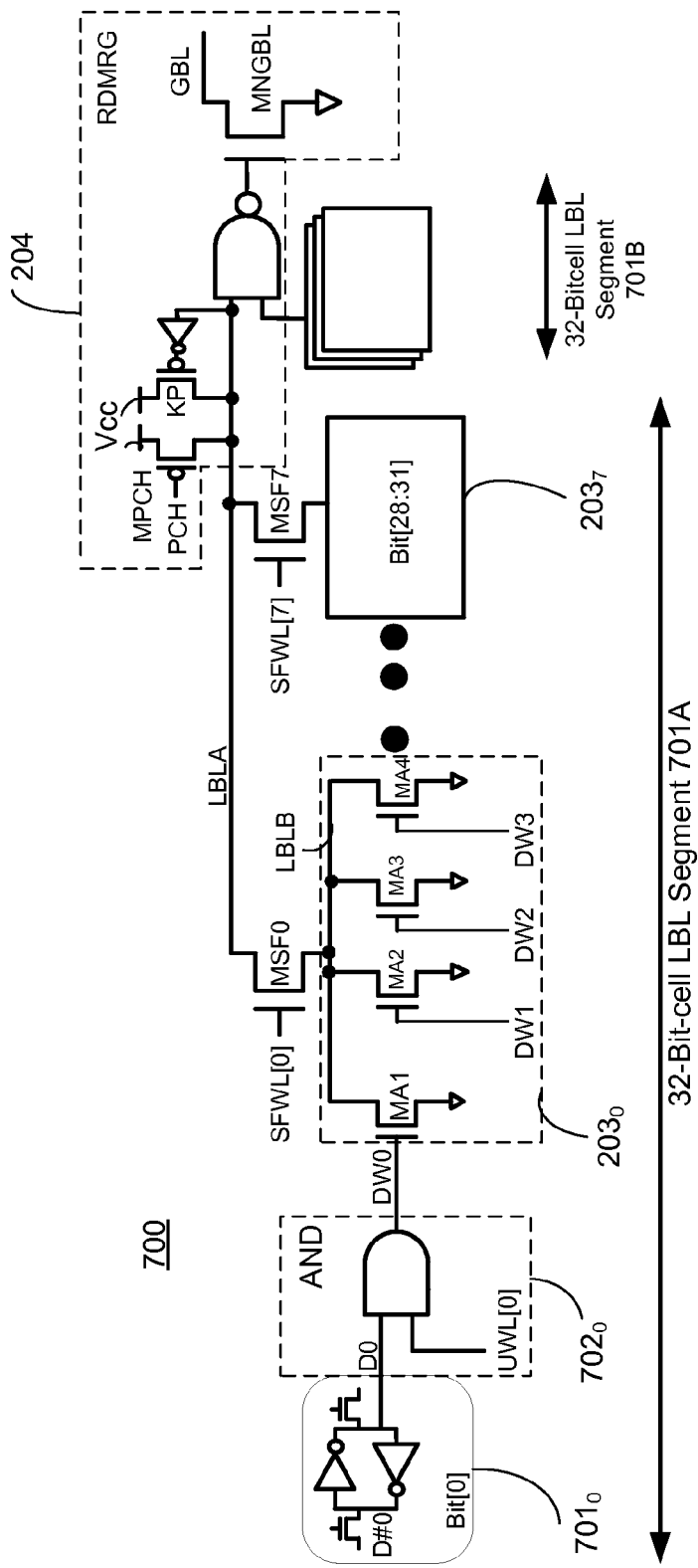
FIG. 7 is AND logic based low power local bit-line circuit for RF architecture, according to one embodiment of the disclosure.

FIG. 7 is an AND logic based low power local bit-line circuit for RF architecture 700, according to one embodiment of the disclosure. It is pointed out that those elements of FIG. 7 having the same reference numbers (or names) as the elements of any other figure can operate or function in any manner similar to that described, but are not limited to such. So as not to obscure the embodiments, the same elements of FIG. 2 are not described again.

The embodiment of RF architecture 700 is similar to RF architecture 200 except that the NOR logic operation of RF architecture 200 is replaced with AND logic operation. Functionally, FIG. 7 is equivalent to FIG. 2. In one embodiment, RF architecture 700 comprises two 32 bit-cell LBL segments 701A and 701B, outputs of which are merged by RDMRG 204 to generate GBL. In one embodiment, 32 bit-cell LBL segment 701A comprises a memory cell $701_0$ coupled to an AND logic unit $702_0$, where the AND logic unit $702_0$ performs AND operation on D0 and UWL[0] signals to generate DW0 signal. Other data word-line signals DW1-DW3 are generated using similar means as $702_0$ (i.e., using $702_{1-3}$, which are not shown, and which are coupled to corresponding memory cells $701_{1-3}$, also not shown). The rest of the operation and elements of RF architecture 700 is the same as RF architecture 200.

Figure 8:
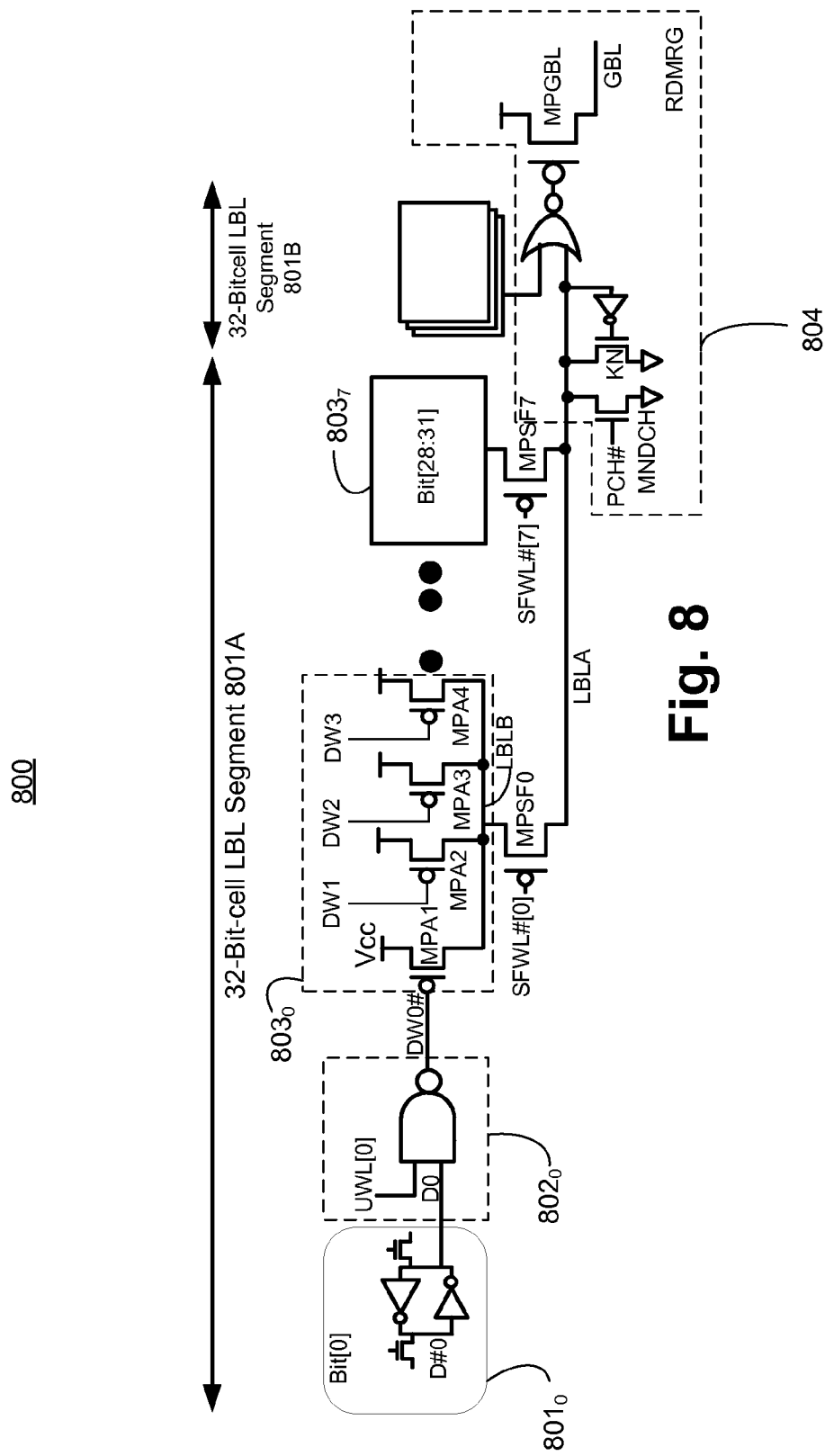
FIG. 8 is NAND logic based low power local bit-line circuit for RF architecture with n-type pre-discharge and p-type domino, according to one embodiment of the disclosure.

FIG. 8 is NAND logic based low power local bit-line circuit for RF architecture 800 with n-type pre-discharge, according to one embodiment of the disclosure. It is pointed out that those elements of FIG. 8 having the same reference numbers (or names) as the elements of any other figure can operate or function in any manner similar to that described, but are not limited to such.

The embodiment of FIG. 8 is similar to the embodiment of FIG. 2 except that the architecture of FIG. 8 is implemented using p-type devices instead of n-type devices in FIG. 2. For example, the RPTs are p-type devices, while the keeper device and "pre-charge" (technically a pre-discharging) device are n-type devices. Functionally, FIG. 8 is equivalent to FIG. 2.

In one embodiment, RF architecture 800 comprises at least two 32 bit-cell LBL segments 801A and 801B, outputs of which are merged to form GBL by RDMRG 804. In one embodiment, RF architecture 800 comprises memory cells (e.g., $801_0$), NAND gating logic 802 (e.g., $802_0$), RPTs 803 (e.g., $803_0$-N, where 'N' is an integer, e.g., 7), stack-force word-line devices (e.g., MPSF0-MPSF7), pre-discharge device MNDCH, n-type keeper device KN, NOR logic 804, and global bit-line generator MPGBL. In this embodiment, a 32 entry 4×8 LBL configuration is shown. However, the embodiments of this disclosure are not limited to the 32 entry 4×8 LBL configuration.

In one embodiment, a static NAND logic is used to generate data word-line using an un-clocked word-line. In such embodiment, read port p-type stacking is enforced which reduces leakage on LBL node during standby (or sleep) mode i.e., regardless of data polarity in the memory cell (e.g., $801_0$), stacking of devices resulting in low (if any) leakage on LBL is realized. The embodiment also results in a two-stack read port with multiplexer select for increased scalability of LBL, enabling increased number of bit-cells per LBL segment.

Compared to RF architecture 200 of FIG. 2, RF architecture 800 of FIG. 8 uses D0 instead of D0# to generate DW0# signal instead of DW0 because MPA1 is a p-type device. Likewise, UWL[0] is used instead of UWL#[0], which is inverse of UWL[0]. Compared to RF architecture 200 of FIG. 2, RF architecture 800 of FIG. 8 uses SFWL#[0] signal to control MPSF0 instead of using SFWL[0] because MPSF0 is a p-type device. Compared to RF architecture 200 of FIG. 2, RF architecture 800 of FIG. 8 uses a pre-discharge device MNDCH instead of a pre-charge device MPCH, where MNDCH is controlled by PCH# (inverse of PCH).

Figure 9:
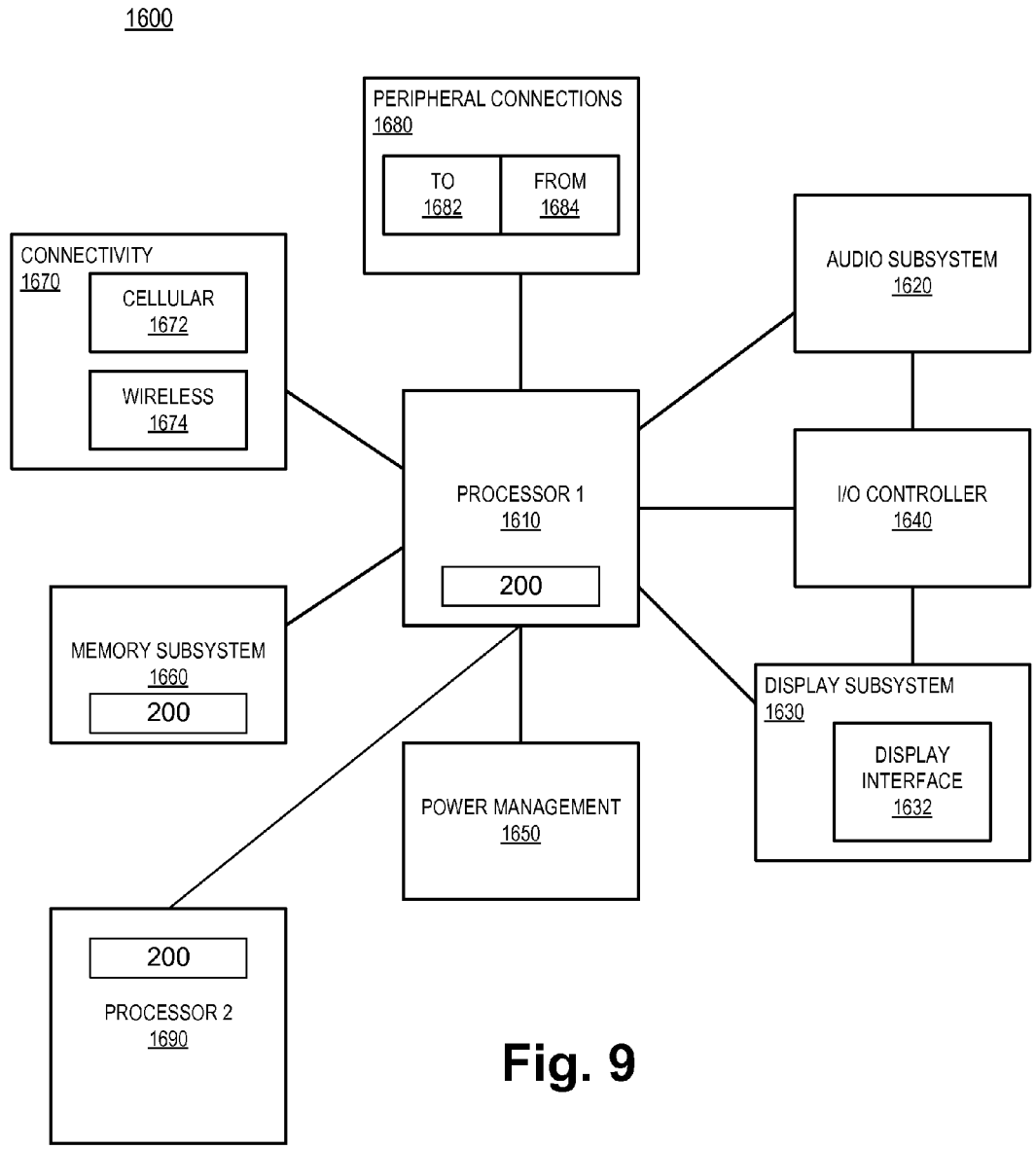
FIG. 9 is a smart device or a computer system with the RF architecture, according to one embodiment of the disclosure.

FIG. 9 is a smart device or a computer system with the RF architecture, according to one embodiment of the disclosure. It is pointed out that those elements of FIG. 9 having the same reference numbers (or names) as the elements of any other figure can operate or function in any manner similar to that described, but are not limited to such. FIG. 9 also illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in device 1600.

In one embodiment, computing device 1600 includes a first processor 1610 with the RF architecture (e.g., 200, 700, 800 and associated logic) discussed in the embodiments, and a second processor 1690 with the RF architecture (e.g., 200, 700, 800 and associated logic) discussed in the embodiments, according to the embodiments discussed herein. Other blocks of the computing device with I/O drivers may also include the RF architecture (e.g., 200, 700, 800 and associated logic) discussed in the embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment an apparatus comprises: a memory cell with a data port; a logic gate, coupled to the data port of the memory cell, to generate a data word-line signal according to data on the data port and an asynchronous word-line signal; and stacked devices to generate local bit-line in response to the data word-line signal and a synchronous word-line signal. In one embodiment, the logic gate is operable to gate the data on the data port to reduce leakage on the node having the local bit-line. In one embodiment, the memory cell is an SRAM cell. In one embodiment, the logic gate is one of a NOR logic gate or a NAND logic gate.

In one embodiment, the stacked devices comprise: a first n-type device coupled to output of the logic gate; and a second n-type device controlled by the synchronous word-line signal. In one embodiment, the second n-type device is shared with a group of n-type devices including the first n-type device. In one embodiment, the apparatus further comprises a first pre-decoder to generate synchronous word-line signal according to a clock signal and an address signal. In one embodiment, the apparatus further comprises a second pre-decoder to generate the asynchronous word-line signal according to the address signal. In one embodiment, the apparatus further comprises a pre-charge device coupled to the stacked devices. In one embodiment, the apparatus further comprises a pre-discharge device coupled to the stacked devices. In one embodiment, the apparatus further comprises a keeper device coupled to the stacked devices. In one embodiment, the apparatus further comprises a logic gate to receive the local bit-line and for generating a global bit-line.

In another example, in one embodiment an apparatus comprises: a memory cell with a data port; and a logic gate, coupled to the data port of the memory cell, to generate a data word-line signal according to data on the data port and an asynchronous word-line signal, wherein the logic gate is operable to gate data on the data port during low power mode.

In one embodiment, the apparatus further comprises: stacked devices to generate local bit-line in response to the data word-line signal and a synchronous word-line signal, wherein the logic gate is operable to gate the data on the data port to reduce leakage on the node having the local bit-line. In one embodiment, the memory cell is an SRAM cell. In one embodiment, the logic gate is at least one of a NOR logic gate or NAND logic gate. In one embodiment, the stacked devices comprise: a first n-type device coupled to output of the logic gate; and a second n-type device controlled by the synchronous word-line signal, wherein the second n-type device is shared with a group of n-type devices including the first n-type device.

In another example, in one embodiment a system comprises: a memory unit; and a processor, coupled to the memory unit, the processor having a register file, the register file including: a memory cell with a data port; a logic gate, coupled to the data port of the memory cell, to generate a data word-line signal according to data on the data port and an asynchronous word-line signal; and stacked devices to generate local bit-line in response to the data word-line signal and a synchronous word-line signal. In one embodiment, the system further comprises: a wireless interface to allow the processor to communicate with other devices; and a display unit. In one embodiment, the logic gate is operable to gate the data on the data port to reduce leakage on the node having the local bit-line, wherein the memory cell is an SRAM cell, and wherein the logic gate is one of a NOR logic gate or a NAND logic gate.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a memory cell with a data port;
   a logic gate, coupled to the data port of the memory cell, to generate a data word-line signal according to data on the data port and an asynchronous word-line signal; and
   stacked devices to generate local bit-line signal in response to the data word-line signal and a synchronous word-line signal.

2. The apparatus of claim 1, wherein the logic gate is operable to gate the data on the data port to reduce leakage on the node having the local bit-line.

3. The apparatus of claim 1, wherein the memory cell is an SRAM cell.

4. The apparatus of claim 1, wherein the logic gate is one of a NOR logic gate or a NAND logic gate.

5. The apparatus of claim 1, wherein the stacked devices comprise:
   a first n-type device coupled to output of the logic gate; and
   a second n-type device controlled by the synchronous word-line signal.

6. The apparatus of claim 5, wherein the second n-type device is shared with a group of n-type devices including the first n-type device.

7. The apparatus of claim 1 further comprises a first pre-decoder to generate synchronous word-line signal according to a clock signal and an address signal.

8. The apparatus of claim 1 further comprises a second pre-decoder to generate the asynchronous word-line signal according to the address signal.

9. The apparatus of claim 1 further comprises a pre-charge device coupled to the stacked devices.

10. The apparatus of claim 1 further comprises a pre-discharge device coupled to the stacked devices.

11. The apparatus of claim 1 further comprises a keeper device coupled to the stacked devices.

12. The apparatus of claim 1 further comprises a logic gate to receive the local bit-line and for generating a global bit-line.

13. An apparatus comprising:
   a memory cell with a data port; and
   a logic gate, coupled to the data port of the memory cell, to generate a data word-line signal according to data on the data port and an asynchronous word-line signal, wherein the logic gate is operable to gate data on the data port during low power mode.

14. The apparatus of claim 13 further comprises:
   stacked devices to generate local bit-line in response to the data word-line signal and a synchronous word-line signal,
   wherein the logic gate is operable to gate the data on the data port to reduce leakage on the node having the local bit-line.

15. The apparatus of claim 13, wherein the memory cell is an SRAM cell.

16. The apparatus of claim 13, wherein the logic gate is at least one of a NOR logic gate or NAND logic gate.

17. The apparatus of claim 13, wherein the stacked devices comprise:
   a first n-type device coupled to output of the logic gate; and
   a second n-type device controlled by the synchronous word-line signal, wherein the second n-type device is shared with a group of n-type devices including the first n-type device.

18. A system comprising:
   a memory unit; and
   a processor, coupled to the memory unit, the processor having a register file, the register file including:
      a memory cell with a data port;
      a logic gate, coupled to the data port of the memory cell, to generate a data word-line signal according to data on the data port and an asynchronous word-line signal; and
      stacked devices to generate local bit-line signal in response to the data word-line signal and a synchronous word-line signal.

19. The system of claim 18 further comprises:
   a wireless interface to allow the processor to communicate with other devices; and
   a display unit.

20. The system of claim 18, wherein the logic gate is operable to gate the data on the data port to reduce leakage on the node having the local bit-line, wherein the memory cell is an SRAM cell, and wherein the logic gate is one of a NOR logic gate or a NAND logic gate.

* * * * *